United States Patent
Jia et al.

(10) Patent No.: US 9,983,452 B2
(45) Date of Patent: May 29, 2018

(54) METHOD FOR DETECTING SUBSTRATE CRACK, SUBSTRATE, AND DETECTION CIRCUIT

(71) Applicant: Huawei Technologies Co., Ltd., Shenzhen (CN)

(72) Inventors: Yanfeng Jia, Yokohama (JP); Lei Tang, Shenzhen (CN); Pengfei Xie, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days. days.

(21) Appl. No.: 15/326,308

(22) PCT Filed: Jul. 15, 2014

(86) PCT No.: PCT/CN2014/082254
§ 371 (c)(1),
(2) Date: Jan. 13, 2017

(87) PCT Pub. No.: WO2016/008099
PCT Pub. Date: Jan. 21, 2016

(65) Prior Publication Data
US 2017/0199439 A1    Jul. 13, 2017

(51) Int. Cl.
*G02F 1/1362*    (2006.01)
*G02F 1/1368*    (2006.01)
(Continued)

(52) U.S. Cl.
CPC ... *G02F 1/136259* (2013.01); *G01R 31/2621* (2013.01); *G02F 1/1368* (2013.01); *H01L 22/32* (2013.01); *H01L 27/124* (2013.01); *G02F 2001/133302* (2013.01); *G02F 2001/136254* (2013.01); *G02F 2201/123* (2013.01)

(58) Field of Classification Search
USPC .......................................................... 257/48
See application file for complete search history.

(56) References Cited

U.S. PATENT DOCUMENTS

2007/0284578 A1* 12/2007 Yoon ..................... G02F 1/1362
257/48
2009/0079928 A1    3/2009 Ohashi et al.
(Continued)

FOREIGN PATENT DOCUMENTS

CN         1619299 A      5/2005
CN      201007763 Y       1/2008
(Continued)

OTHER PUBLICATIONS

Machine Translation and Abstract of Chinese Publication No. CN1619299, dated May 25, 2005, 10 pages.
(Continued)

*Primary Examiner* — Marcos D Pizarro
*Assistant Examiner* — Lawrence Tynes, Jr.
(74) *Attorney, Agent, or Firm* — Conley Rose, P.C.

(57) ABSTRACT

A method for detecting a substrate crack, a substrate, and a detection circuit. A non-closed test line having an opening is peripherally disposed along an edge of a glass substrate of a TFT substrate. Whether an edge of the TFT substrate has a crack or chip can be determined by measuring whether the test line is on or off. In this way, a detection omission can be avoided, detection efficiency is improved, and after the TFT substrate is used to assemble a liquid crystal module or the liquid crystal module is used to assemble a complete device, whether the edge of the TFT substrate in the liquid crystal module has a crack or chip can also be detected.

9 Claims, 4 Drawing Sheets

(51) Int. Cl.
  *H01L 21/66* (2006.01)
  *H01L 27/12* (2006.01)
  *G01R 31/26* (2014.01)
  *G02F 1/1333* (2006.01)

(56) References Cited

U.S. PATENT DOCUMENTS

2010/0134137 A1 6/2010 Kida
2012/0262184 A1* 10/2012 Shen ................ G09G 3/006
  324/537
2014/0085281 A1* 3/2014 Lim ................ G09G 3/3266
  345/206

FOREIGN PATENT DOCUMENTS

| CN | 101652705 A | 2/2010 | |
| CN | 102338943 * | 2/2012 | ............... G02F 1/13 |
| CN | 102338943 A | 2/2012 | |
| JP | 2009085925 A | 4/2009 | |
| JP | 2009093132 A | 4/2009 | |
| KR | 20090078566 A | 7/2009 | |

OTHER PUBLICATIONS

Machine Translation and Abstract of Chinese Publication No. CN102338943, dated Feb. 1, 2012, 15 pages.
Machine Translation and Abstract of Chinese Publication No. CN201007763, dated Jan. 16, 2008, 4 pages.
Machine Translation and Abstract of Japanese Publication No. JP2009085925, dated Apr. 23, 2009, 21 pages.
Foreign Communication From a Counterpart Application, PCT Application No. PCT/CN2014/082254, English Translation of International Search Report dated Mar. 30, 2015, 3 pages.
Foreign Communication From a Counterpart Application, PCT Application No. PCT/CN2014/082254, English Translation of Written Opinion dated Mar. 30, 2015, 14 pages.

* cited by examiner

METHOD FOR DETECTING SUBSTRATE CRACK, SUBSTRATE, AND DETECTION CIRCUIT

CROSS REFERENCE TO RELATED APPLICATIONS

This application is a national stage of International Application No. PCT/CN2014/082254, filed on Jul. 15, 2014, which is hereby incorporated by reference in its entirety.

TECHNICAL FIELD

Embodiments of the present disclosure relate to the field of a liquid crystal display (LCD) panel manufacturing, and in particular, to a method for detecting a substrate crack, a substrate, and a detection circuit.

BACKGROUND

A thin film transistor (TFT) substrate (or referred to as a TFT glass) is one of basic components and one of key basic materials of an LCD. The TFT substrate is a glass substrate, and the glass substrate is a thin glass sheet whose surface is extremely flat. In a process of manufacturing an LCD panel, a transparent conducting layer, that is, an indium tin oxide (ITO) film layer, is deposited by evaporation on a surface of the glass substrate, and transparent conducting patterns are formed by means of photolithography, where these patterns include a pixel pattern and a pattern of an outer lead.

Typically, after manufacture of a complete TFT substrate is completed, the TFT substrate is cut into multiple TFT substrates of a specified size. For example, currently, a prior-art substrate at a highest stage of a fifth-generation lead has a size of 1200*1300 millimeters (mm), and can be cut into six substrates for use of a 27-inch wide-screen television. However, at present, detection for the TFT substrate is mainly performed after the cutting, and is generally performed by detection personnel using an automatic optic inspection (AOI) optical device (for example, a microscope). By means of this method, a small crack or chip occurring in a cut edge of a TFT substrate in a cutting process can be detected.

However, the foregoing detection method is mainly implemented depending on manual detection, detection efficiency is low, and a detection omission may further occur. Moreover, in the foregoing detection method, only the small crack or chip occurring in the cutting process can be detected, a crack or chip occurring in a process in which the TFT substrate is used to assemble an liquid crystal module (LCM) or a transportation process cannot be detected, and a crack or chip occurring in a process in which the LCM is used to assemble a complete device (for example, assemble a television or a mobile phone) cannot be detected, either.

SUMMARY

Embodiments of the present disclosure provide a method for detecting a substrate crack, a substrate, and a detection circuit, which can improve detection efficiency, avoid a detection omission, and can perform detection for a TFT substrate after the TFT substrate is used to assemble an LCM or the LCM is used to assemble a complete device.

According to a first aspect, a TFT substrate is provided, where the TFT substrate includes a glass substrate, where a non-closed test line having an opening is peripherally disposed on the glass substrate along an edge of the glass substrate, and the opening is formed by two end points of the test line, where a test point is provided at a position on the test line that is a set distance away from each end point, the test point is configured to connect to a measurement tool that can determine whether the test line is on or off, to determine whether an edge of the TFT substrate has a crack or chip, and one of the two end points is grounded.

With reference to the first aspect, in a first possible implementation manner, the opening is located in an interference fit flexible printed circuit board on glass (FOG) bonding region between a flexible printed circuit board and the glass substrate, and the two end points of the opening are electrically connected to a first connector interface using the flexible printed circuit board, where the first connector interface is configured to electrically connect to a connector interface of a detection circuit, and the detection circuit is configured to measure whether the test line is on or off, to determine whether the edge of the TFT substrate has a crack or chip.

With reference to the first aspect or the first possible implementation manner of the first aspect, in a second possible implementation manner, a conducting layer of the test line is manufactured as any conducting layer in a TFT substrate manufacturing process, where the test line is manufactured together with a conductive pattern of the conducting layer in a patterning process for the conducting layer.

With reference to the second possible implementation manner of the first aspect, in a third possible implementation manner, the conducting layer includes any one of a gate metal layer, a source/drain metal layer, or a transparent conducting thin film, and that a conducting layer of the test line is manufactured as any conducting layer in a TFT substrate manufacturing process, where the test line is manufactured together with a conductive pattern of the conducting layer in a patterning process for the conducting layer includes the conducting layer of the test line is manufactured as the gate metal layer, where the test line is manufactured together with a gate metal wire in a patterning process for the gate metal layer, or the conducting layer of the test line is manufactured as the source/drain metal layer, where the test line is manufactured together with a source/drain metal wire in a patterning process for the source/drain metal layer, or the conducting layer of the test line is manufactured as the transparent conducting thin film, where the test line is manufactured together with a pixel electrode in a patterning process for the transparent conducting thin film.

With reference to the third possible implementation manner of the first aspect, in a fourth possible implementation manner, if the conducting layer of the test line is manufactured as the gate metal layer or the source/drain metal layer, a distance between the test line and the edge of the glass substrate is 150 micrometer (μm) to 200 μm, or if the conducting layer of the test line is manufactured as the transparent conducting thin film, a distance between the test line and the edge of the glass substrate is 100 μm.

According to a second aspect, a TFT substrate is provided, where the TFT substrate includes a glass substrate, where a non-closed test line having an opening is peripherally disposed on the glass substrate along an edge of the glass substrate, the opening is formed by two end points of the test line, where one of the two end points is grounded, and the opening is located in an interference fit FOG bonding region between a flexible printed circuit board and the glass substrate, and the two end points of the opening are electrically connected to a first connector interface using the flexible printed circuit board, where the first connector interface is configured to electrically connect to a connector interface of a detection circuit, and the detection circuit is configured to measure whether the test line is on or off, to determine whether an edge of the TFT substrate has a crack or chip.

With reference to the second aspect, in a first possible implementation manner, a conducting layer of the test line is manufactured as any conducting layer in a TFT substrate manufacturing process, where the test line is manufactured together with a conductive pattern of the conducting layer in a patterning process for the conducting layer.

With reference to the first possible implementation manner of the second aspect, in a second possible implementation manner, the conducting layer includes any one of a gate metal layer, a source/drain metal layer, or a transparent conducting thin film, and that a conducting layer of the test line is manufactured as any conducting layer in a TFT substrate manufacturing process, where the test line is manufactured together with a conductive pattern of the conducting layer in a patterning process for the conducting layer includes the conducting layer of the test line is manufactured as the gate metal layer, where the test line is manufactured together with a gate metal wire in a patterning process for the gate metal layer, or the conducting layer of the test line is manufactured as the source/drain metal layer, where the test line is manufactured together with a source/drain metal wire in a patterning process for the source/drain metal layer, or the conducting layer of the test line is manufactured as the transparent conducting thin film, where the test line is manufactured together with a pixel electrode in a patterning process for the transparent conducting thin film.

With reference to the second possible implementation manner of the second aspect, in a third possible implementation manner, if the conducting layer of the test line is manufactured as the gate metal layer or the source/drain metal layer, a distance between the test line and the edge of the glass substrate is 150 µm to 200 µm, or if the conducting layer of the test line is manufactured as the transparent conducting thin film, a distance between the test line and the edge of the glass substrate is 100 µm.

According to a third aspect, a detection circuit is provided, where the detection circuit includes an analog to digital converter interface, a power supply, a resistor, a second connector interface, and a test bed, where the power supply is electrically connected to a first end of the resistor, a second end of the resistor is electrically connected to the second connector interface, a first end of the analog to digital converter interface is electrically connected to the second end of the resistor, a second end of the analog to digital converter interface is electrically connected to the test bed, when the first connector interface in the TFT substrate according to any one of the first possible implementation manner of the first aspect of the claims to the third possible implementation manner of the second aspect is electrically connected to the second connector interface, a series circuit including the power supply, the resistor, and the TFT substrate is formed, and the test bed is configured to measure an electrical parameter at a connection point between the resistor and the second connector interface in the series circuit, and determine, according to the electrical parameter, whether an edge of the TFT substrate has a crack or chip.

With reference to the third aspect, in a first possible implementation manner, the first connector interface and the second connector interface are board to board (BTB) interfaces, where the first connector interface is a BTB interface female socket, and the second connector interface is a BTB interface male header.

According to a fourth aspect, a LCD is provided, including the TFT substrate according to any one of the first aspect to the third possible implementation manner of the second aspect.

According to a fifth aspect, an electronic terminal is provided, including the LCD according to the fourth aspect.

According to a sixth aspect, a method for detecting a substrate crack is provided, where the method includes acquiring an electrical parameter of a test line on a TFT substrate using a measurement tool, where the test line is a non-closed test line that is peripherally disposed along an edge of a glass substrate of the TFT substrate and that has an opening, and the opening is formed by two end points of the test line, where a test point is provided at a position on the test line that is a set distance away from each end point, and the test point is configured to connect to the measurement tool, and determining, according to the electrical parameter, whether the test line is on or off, to determine whether an edge of the TFT substrate has a crack or chip.

With reference to the sixth aspect, in a first possible implementation manner, the acquiring an electrical parameter of a test line on a TFT substrate using a measurement tool includes acquiring a value of resistance of the test line using a multimeter.

With reference to the first possible implementation manner of the sixth aspect, in a second possible implementation manner, the determining, according to the electrical parameter, whether an edge of the TFT substrate has a crack or chip includes determining whether the value of the resistance of the test line is infinite, and if the resistance value is infinite, determining that the edge of the TFT substrate has a crack or chip, or if the resistance value is not infinite, determining that the edge of the TFT substrate does not have a crack or chip.

With reference to the sixth aspect, in a third possible implementation manner, the measurement tool includes a multimeter and an external power supply, where the multimeter, the external power supply, and the test line form a loop, and the acquiring an electrical parameter of a test line on a TFT substrate using a measurement tool includes acquiring a value of a current in the test line using the multimeter.

With reference to the third possible implementation manner of the sixth aspect, in a fourth possible implementation manner, the determining, according to the electrical parameter, whether an edge of the TFT substrate has a crack or chip includes determining whether the value of the current in the test line is zero, and if the current value is zero, determining that the edge of the TFT substrate has a crack or chip, or if the current value is not zero, determining that the edge of the TFT substrate does not have a crack or chip.

With reference to the sixth aspect, in a fifth possible implementation manner, the measurement tool includes an indicator and an external power supply, where the indicator, the external power supply, and the test line form a loop, and the acquiring an electrical parameter of a test line on a TFT substrate using a measurement tool includes acquiring, using the indicator, whether the test line is off or on.

With reference to the fifth possible implementation manner of the sixth aspect, in a sixth possible implementation manner, the determining, according to the electrical parameter, whether an edge of the TFT substrate has a crack or chip includes if the test line is off, determining that the edge of the TFT substrate has a crack or chip, or if the test line is on, determining that the edge of the TFT substrate does not have a crack or chip.

With reference to the sixth aspect, in a seventh possible implementation manner, the opening is located in an interference fit FOG bonding region between a flexible printed circuit board and the glass substrate, and the two end points of the opening are electrically connected to a first connector interface using the flexible printed circuit board, where the first connector interface is configured to electrically connect to a connector interface of a detection circuit that can determine whether the test line of the TFT substrate is on or off, and the method further includes after the TFT substrate is used to assemble a LCM, detecting, using the detection circuit, whether the edge of the TFT substrate in the LCM has a crack or chip.

With reference to the seventh possible implementation manner of the sixth aspect, in an eighth possible implementation manner, the method further includes after the LCM is used to assemble a complete device, detecting, using the detection circuit, whether the edge of the TFT substrate in the LCM has a crack or chip.

With reference to the seventh or the eighth possible implementation manner of the sixth aspect, in a ninth possible implementation manner, the determining, according to the detection circuit, whether the edge of the TFT substrate in the LCM has a crack or chip includes acquiring, using the detection circuit, an electrical parameter at a connector in the detection circuit, and determining, according to the electrical parameter, whether the edge of the TFT substrate in the LCM has a crack or chip.

With reference to the ninth possible implementation manner of the sixth aspect, in a tenth possible implementation manner, the electrical parameter includes a voltage value or a current value, and the determining, according to the electrical parameter, whether the edge of the TFT substrate in the LCM has a crack or chip includes determining whether the voltage value is equal to a value of a voltage of a power supply of the detection circuit, and if the voltage value is equal to the value of the voltage of the power supply, determining that the edge of the TFT substrate in the LCM has a crack or chip, or otherwise, determining that the edge of the TFT substrate in the LCM does not have a crack or chip, or determining whether the current value is equal to zero, and if the current value is equal to zero, determining that the edge of the TFT substrate in the LCM has a crack or chip, or otherwise, determining that the edge of the TFT substrate in the LCM does not have a crack or chip.

According to a seventh aspect, a method for detecting a substrate crack is provided, where the method includes acquiring, using a detection circuit, an electrical parameter at a connection between a TFT substrate and the detection circuit, where a non-closed test line having an opening is peripherally disposed on the TFT substrate along an edge of a glass substrate, the opening is formed by two end points of the test line, where one of the two end points is grounded, and the opening is located in an interference fit FOG bonding region between a flexible printed circuit board and the glass substrate, and the two end points of the opening are electrically connected to a first connector interface using the flexible printed circuit board, where the first connector interface is configured to electrically connect to a connector interface of the detection circuit, and determining, according to the electrical parameter, whether the test line is on or off, to determine whether an edge of the TFT substrate has a crack or chip.

The embodiments of the present disclosure provide a method for detecting a substrate crack, a substrate, and a detection circuit, where a non-closed test line having an opening is peripherally disposed along an edge of a glass substrate of a TFT substrate, and whether an edge of the TFT substrate has a crack or chip can be determined by measuring whether the test line is on or off. Compared with visual measurement used in the prior art, a detection omission can be avoided, detection efficiency is improved, and after the TFT substrate is used to assemble a LCM or the LCM is used to assemble a complete device, whether the edge of the TFT substrate in the LCM has a crack or chip can also be detected.

BRIEF DESCRIPTION OF DRAWINGS

To describe the technical solutions in the embodiments of the present disclosure or in the prior art more clearly, the following briefly describes the accompanying drawings required for describing the embodiments or the prior art. The accompanying drawings in the following description show some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
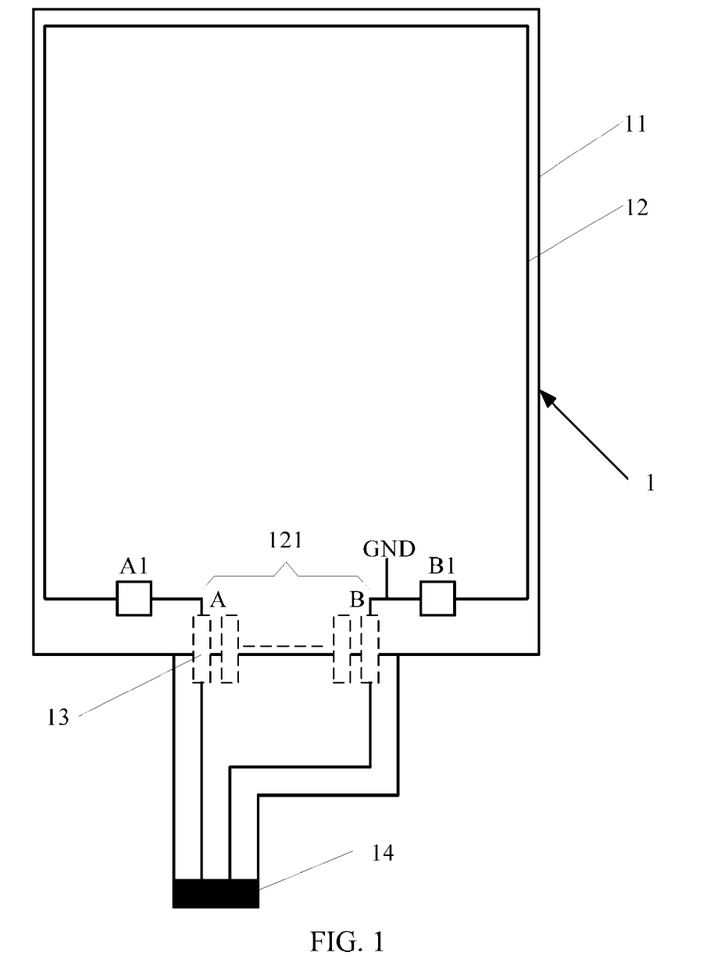
FIG. 1 is a schematic structural diagram of a TFT substrate according to an embodiment of the present disclosure.

An embodiment of the present disclosure provides a TFT substrate 1. As shown in FIG. 1, the TFT substrate 1 includes a glass substrate 11, where a non-closed test line 12 having an opening 121 is peripherally disposed on the glass substrate 11 along an edge of the glass substrate, and the opening 121 is formed by two end points A and B of the test line 12, where a test point is provided at a position that is a set distance away from each end point, for example, a test point A1 and a test point B1 shown in FIG. 1 are respectively located close to the end point A and the end point B, and the test points A1 and B1 are configured to connect to a measurement tool that can determine whether the test line is on or off, and one of the two end points is grounded (exemplarily, in FIG. 1, the end point B is grounded, and is generally connected to a ground (GND) end of the TFT substrate 1). It is easily understood that a length of the set distance is not limited in this embodiment of the present disclosure, and a set distance that makes the two test points close to the two end points is preferred.

In an embodiment, as shown in FIG. 1, the opening 121 is located in an interference fit region between an flexible printed circuit board (FPC) on the glass substrate and the glass substrate, where the region may be referred to as an FOG bonding (FOG Bonding) region 13. The position of the opening 121 is exemplary, the present disclosure includes but is not limited to the position, and in another possible embodiment, the opening 121 may be located at another position.

In an embodiment, the test line 12 may be manufactured using a TFT substrate manufacturing process, and a conducting layer of the test line 12 may be manufactured as any conducting layer in the prior-art TFT substrate manufacturing process. The test line 12 is manufactured together with a conductive pattern of the conducting layer in a patterning process for the conducting layer. It should be noted that the test point A1 and the test point B1 on the test line 12 are manufactured together with the test line 12. After manufacture of the test line 12 is completed, an insulation layer is further disposed on the test line 12, and another metal layer or insulation layer may be further disposed on the insulation layer of the test line 12 to complete a subsequent TFT substrate manufacturing process. At the test point A1 and the test point B1, via holes are formed on the other layers covering the test line 12 and run through the layers, to expose the test point A1 and the test point B1 such that the test point A1 and the test point B1 can be connected to the measurement tool.

The conducting layer may be any one of a gate metal layer, a source/drain metal layer, or a transparent conducting thin film.

If the conducting layer of the test line is manufactured as the gate metal layer, the test line is manufactured together with a gate metal wire in a patterning process for the gate metal layer, or the conducting layer of the test line is manufactured as the source/drain metal layer, where the test line is manufactured together with a source/drain metal wire in a patterning process for the source/drain metal layer, or the conducting layer of the test line is manufactured as the transparent conducting thin film, where the test line is manufactured together with a pixel electrode in a patterning process for the transparent conducting thin film.

The conducting layer may be manufactured by means of magnetron sputtering or another film forming method such that a metal layer of a particular thickness is deposited. If the gate metal layer or the source/drain metal layer is manufactured, metal, such as molybdenum, aluminum, aluminum nickel alloy, molybdenum-tungsten alloy, chromium, or copper may be used, or a combination thereof may be used. If the transparent conducting thin film is manufactured, ITO, indium zinc oxide (IZO), or another transparent electrode material may be used.

The patterning process may include after the metal layer is manufactured, obtaining the test line 12 and another conductive pattern of the conducting layer through processes such as development and etching. It can be seen that the test line 12 is manufactured using a prior-art manufacturing process, and process complexity is not increased.

In addition, a distance between the test line 12 and the edge of the glass substrate 11 is determined by a process capacity, and in manufacture of different metal layers, the distances between the test line 12 and the edge of the glass substrate 11 are also different, for example if the test line 12 is manufactured together with the gate metal layer or the source/drain metal layer in a patterning process of manufacturing the gate metal layer or the source/drain metal layer, the distance between the test line 12 and the edge of the glass substrate 11 is 150 μm to 200 μm, or if the test line 12 is manufactured together with the transparent conducting thin film in a patterning process of manufacturing the transparent conducting thin film, the distance between the test line 12 and the edge of the glass substrate 11 is about 100 μm.

During detection, a measurement tool (also referred to as a jig) such as a multimeter may be used to measure an electrical parameter of the test line 12. For example, two measurement pens of the multimeter are respectively connected to the two measurement points A1 and B1 of the test line 12, and a value of resistance of the test line 12 is acquired using the multimeter, where if the value of the resistance of the test line 12 is infinite, it indicates that the test line 12 is off, and it may be determined that the edge of the TFT substrate has a crack or chip, or if the value of the resistance of the test line 12 is not infinite, it indicates that the test line 12 is complete, and it may be determined that the edge of the TFT substrate does not have a crack or chip, or the multimeter, an external power supply, and the test line 12 may be connected in series to form a loop, and a value of a current in the test line 12 is acquired using the multimeter, where if the value of the current in the test line 12 is zero, it indicates that the test line 12 is off, and it may be determined that the edge of the TFT substrate has a crack or chip, or otherwise, it indicates that the test line 12 is complete, and it may be determined that the edge of the TFT substrate does not have a crack or chip, or an indicator, an external power supply, and the test line 12 are connected in series to form a loop, and an indication about whether the test line 12 is on or off is acquired using the indicator, where if the test line 12 is off, it may be determined that the edge of the TFT substrate has a crack or chip, or if the test line is on, it may be determined that the edge of the TFT substrate does not have a crack or chip.

The foregoing measurement methods are merely exemplary, and another detection method may be used to detect whether the test line 12 is on or off.

In an embodiment, the two end points A and B of the test line 12 may be further electrically connected to a first connector interface 14 using the FPC, where the first connector interface 14 is configured to electrically connect to a connector interface of a detection circuit. The detection circuit is any detection circuit that can detect whether the test line 12 on the TFT substrate 1 is on or off. The TFT substrate 1 may be detected by the detection circuit after completion of substrate cutting, or after the TFT substrate 1 is used to assemble an LCM, or after the LCM including the TFT substrate 1 is used to assemble a terminal. The detection circuit may be an independent detection circuit, and the TFT substrate 1 is detected through external connection to the detection circuit, or the detection circuit may be integrated into a LCM or a terminal, the terminal is used as a test bed, and the LCM of the terminal can be detected using software for controlling the detection circuit. Exemplarily, the detection circuit may be a detection circuit provided in an embodiment below.

The first connector interface 14 and the connector interface of the detection circuit may be BTB interfaces (or referred to as B2B interfaces). For example, the first connector interface 14 is a BTB interface female socket, and the connector interface of the detection circuit is a BTB interface male header.

Certainly, the BTB interface being used as the connector interface is merely exemplary, and another interface may be used besides the BTB interface.

According to the TFT substrate provided in this embodiment of the present disclosure, a non-closed test line having an opening is peripherally disposed along an edge of a glass substrate of the TFT substrate, the opening is formed by two end points of the test line, where a test point is disposed at each end point, and the test point is configured to connect to a measurement tool that can determine whether the test line is on or off, and whether an edge of the TFT substrate has a crack or chip can be determined by measuring by the measurement tool whether the test line is on or off. Compared with visual measurement used in the prior art, a detection omission can be avoided, detection efficiency is improved, and after the TFT substrate is used to assemble a LCM or the LCM is used to assemble a complete device, whether the edge of the TFT substrate in the LCM has a crack or chip can also be detected.

Figure 2:
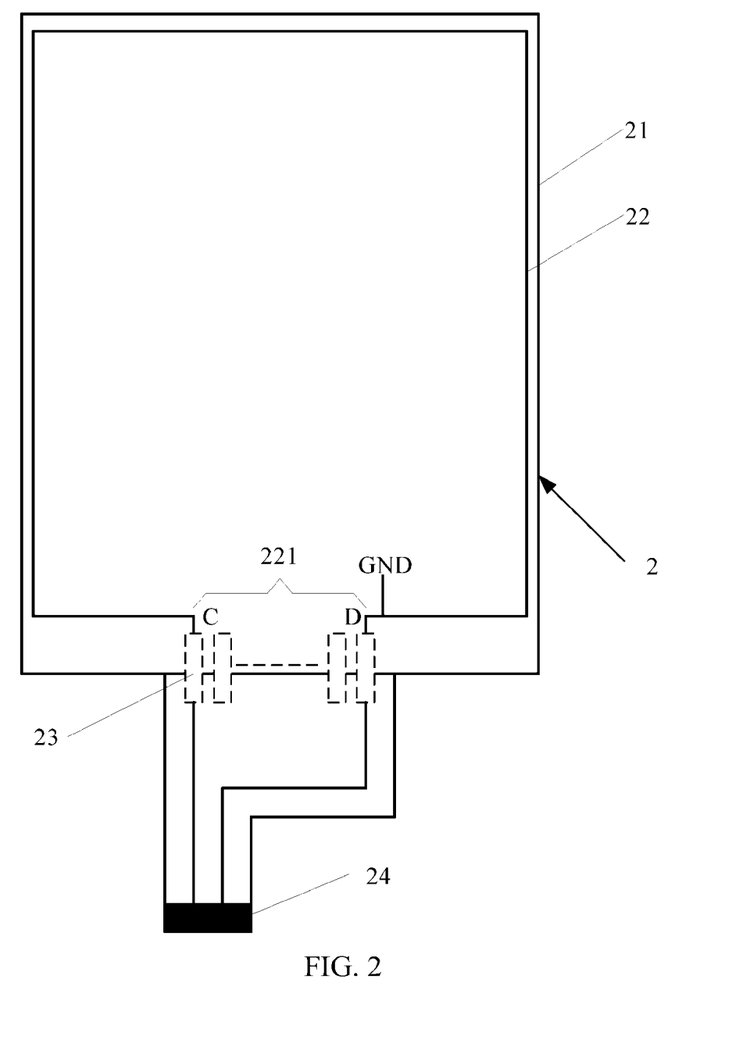
FIG. 2 is another schematic structural diagram of a TFT substrate according to an embodiment of the present disclosure.

An embodiment of the present disclosure provides a TFT substrate 2. As shown in FIG. 2, the TFT substrate 2 includes a glass substrate 21, where a non-closed test line 22 having an opening 221 is peripherally disposed on the glass substrate 21 along an edge of the glass substrate 21, the opening 221 is formed by two end points C and D of the test line 22, where one of the two end points is grounded (exemplarily, in FIG. 2, the end point D is grounded, and is generally connected to a GND end of the TFT substrate 2), and the opening 221 is located in an FOG bonding region 23, and the two end points A and B of the opening 221 are electrically connected to a first connector interface 24 using a flexible printed circuit board, where the first connector interface 24 is configured to electrically connect to a connector interface of a detection circuit, and the detection circuit is configured to measure whether the test line 22 is on or off, to determine whether an edge of the TFT substrate 2 has a crack or chip.

In an embodiment, the test line 22 may be manufactured using a prior-art TFT substrate manufacturing process, and a conducting layer of the test line 22 may be manufactured as any conducting layer in the prior-art TFT substrate manufacturing process, where the test line 22 is manufactured together with a conductive pattern of the conducting layer in a patterning process for the conducting layer. A specific manufacturing process is completely consistent with the process of the test line 12 in the TFT substrate 1, which is not described again.

During detection, the detection circuit that is externally connected to the TFT substrate 2 detects whether the edge of the TFT substrate 2 has a crack or chip. The detection circuit is any detection circuit that can detect whether the test line 22 on the TFT substrate 2 is on or off. The TFT substrate 2 may be detected by the detection circuit after completion of substrate cutting, or after the TFT substrate 2 is used to assemble an LCM, or after the LCM including the TFT substrate 2 is used to assemble a terminal. The detection circuit may be an independent detection circuit, and the TFT substrate 2 is detected through external connection to the detection circuit, or the detection circuit may be integrated into a LCM or a terminal, the terminal is used as a test bed, and the LCM of the terminal can be detected using software for controlling the detection circuit. Exemplarily, the detection circuit may be a detection circuit provided in an embodiment below.

According to the TFT substrate provided in this embodiment of the present disclosure, a non-closed test line having an opening is peripherally disposed along an edge of a glass substrate of the TFT substrate, the opening is formed by two end points of the test line, the two end points of the opening are electrically connected to a first connector interface using a flexible printed circuit board, the first connector interface is configured to electrically connect to a connector interface of a detection circuit, and whether an edge of the TFT substrate has a crack or chip can be determined by measuring by the detection circuit whether the test line is on or off. Compared with visual measurement used in the prior art, a detection omission can be avoided, detection efficiency is improved, and after the TFT substrate is used to assemble a LCM or the LCM is used to assemble a complete device, whether the edge of the TFT substrate in the LCM has a crack or chip can also be detected.

Figure 3:
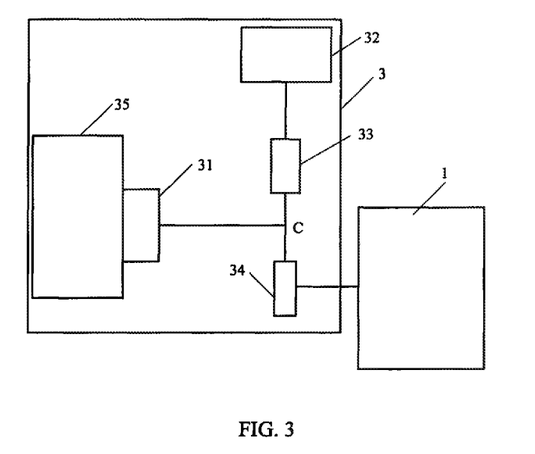
FIG. 3 is a schematic structural diagram of a detection circuit according to an embodiment of the present disclosure.
Figure 4:
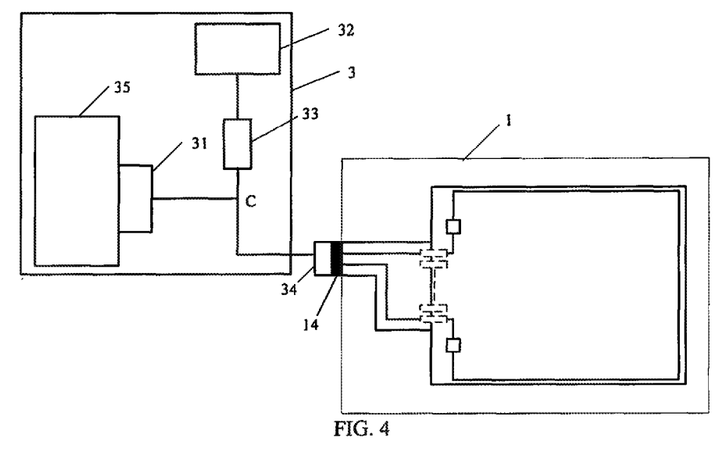
FIG. 4 is a schematic diagram of connection between a TFT substrate and a detection circuit according to an embodiment of the present disclosure.

An embodiment of the present disclosure further provides a detection circuit. As shown in FIG. 3, the detection circuit 3 includes an analog to digital converter interface 31, a power supply 32, a resistor 33, a second connector interface 34, and a test bed 35, where the power supply 32 is electrically connected to a first end of the resistor 33, a second end of the resistor 33 is electrically connected to the second connector interface 34, a first end of the analog to digital converter interface 31 is electrically connected to the second end of the resistor 33, a second end of the analog to digital converter interface 31 is electrically connected to the test bed 35, when the first connector interface 14 in the TFT substrate 1 (or the first connector interface 24 in the TFT substrate 2) is electrically connected to the second connector interface 34, a series circuit including the power supply 32, the resistor 33, and the TFT substrate 1 (or the TFT substrate 2) (a diagram of actual connection may be as shown in FIG. 4) is formed, and the test bed 35 is configured to measure an electrical parameter at a connection point C between the resistor 33 and the second connector interface 34, and determine, according to the electrical parameter, whether an edge of the TFT substrate 1 (or the TFT substrate 2) has a crack or chip.

Exemplarily, for example, the detection circuit 3 is connected to the TFT substrate 1 (an implementation manner in which the TFT substrate 2 is used is not shown in FIG. 3). Because the test line 12 in the TFT substrate 1 has internal resistance, the power supply 32, the resistor 33, the test line 12, and a GND end of the TFT substrate 1 form a series circuit. According to FIG. 3, a voltage at the C point is a voltage divided by the internal resistance of the test line 12, and it may be known from a voltage division formula of the series circuit that the voltage is $$V_C = V \frac{R_T}{R + R_T}$$

where $V_C$ represents the voltage at the C point, V represents a voltage of the power supply 23, $R_T$ represents resistance of the test line 12, and R represents resistance of the resistor 33, where the power supply 32 may be 1.8 V (volt), and the resistor 33 may be 1 MΩ (Mega Ohm).

When the edge of the TFT substrate 1 has a crack or chip, the test line 12 is off at the crack or chip, and in this case, the resistance $R_T$ of the test line 12 is infinite, and $V_C$ is equal to V.

Therefore, as long as it is measured that the voltage at the C point is equal to the voltage of the power supply 32, it may be determined that the edge of the TFT substrate 1 has a crack or chip.

The TFT substrate may be detected by the detection circuit 3 after completion of substrate cutting, or after the TFT substrate is used to assemble an LCM, or after the LCM including the TFT substrate is used to assemble a terminal. The detection circuit 3 may be an independent detection circuit, and the TFT substrate is detected through external connection to the detection circuit 3, or the detection circuit 3 may be integrated into a LCM or a terminal, the terminal is used as a detection bed, and the LCM of the terminal can be detected using software for controlling the detection circuit.

According to the detection circuit provided in this embodiment of the present disclosure, whether an edge of a TFT substrate has a crack or chip can be determined by measuring whether a test line is on or off. Compared with visual measurement used in the prior art, a detection omission can be avoided, detection efficiency is improved, and after the TFT substrate is used to assemble a LCM or the LCM is used to assemble a complete device, whether the edge of the TFT substrate in the LCM has a crack or chip can also be detected.

An embodiment of the present disclosure further provides a LCD, where the LCD includes the TFT substrate 1 (or the TFT substrate 2) provided in the foregoing embodiment, liquid crystal, a color filter substrate, a polarizer, a backlight, and a light guide plate.

The backlight and the light guide plate provide a light source for the LCD, the TFT substrate 1 (or the TFT substrate 2) are above the backlight and the light guide plate, the liquid crystal is disposed between the TFT substrate 1 (or the TFT substrate 2) and the color filter substrate, the liquid crystal is disposed in sealant between the TFT substrate 1 (or the TFT substrate 2) and the color filter substrate, and the polarizer is disposed above the color filter substrate.

An embodiment of the present disclosure further provides an electronic terminal, where the electronic terminal includes the foregoing LCD.

In an embodiment, the foregoing LCD may further include the detection circuit 3 described in the foregoing embodiment.

Figure 5:
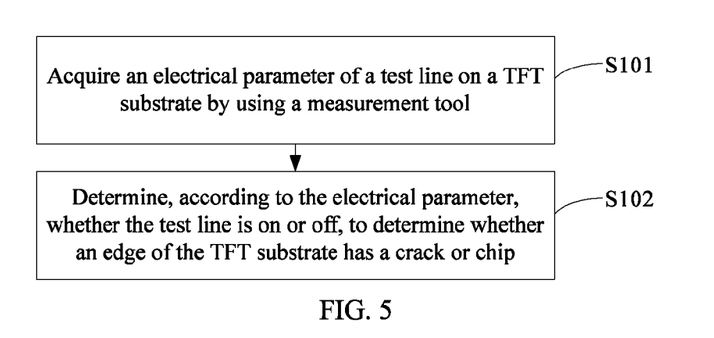
FIG. 5 is a schematic flowchart of a method for detecting a substrate crack according to an embodiment of the present disclosure.

An embodiment of the present disclosure provides a method for detecting a substrate crack. As shown in FIG. 5, the method includes S101: Acquire an electrical parameter of a test line on a TFT substrate using a measurement tool.

The TFT substrate may be the TFT substrate 1 provided in the foregoing embodiment. As shown in FIG. 1, there is a test line 12 on the TFT substrate 1, the test line 12 is a non-closed test line that is peripherally disposed along an edge of a glass substrate 11 of the TFT substrate 1 and that has an opening 121, and the opening 121 is formed by two end points A and B of the test line 12, where a test point is provided at a position that is a set distance away from each end point, for example, A1 and B1 shown in FIG. 1, and the test points A1 and B1 are configured to connect to the measurement tool that can measure whether the test line 12 is on or off.

S102: Determine, according to the electrical parameter, whether the test line is on or off, to determine whether an edge of the TFT substrate has a crack or chip.

The electrical parameter may be a parameter, such as a resistance value, a current value, or a voltage value.

According to the method for detecting a substrate crack provided in this embodiment of the present disclosure, an electrical parameter of a test line on a TFT substrate is measured using a measurement tool, and it is determined according to the electrical parameter of the test line whether the test line is on or off such that it can be determined whether an edge of the TFT substrate has a crack or chip. Compared with visual measurement used in the prior art, a detection omission can be avoided, detection efficiency is improved, and after the TFT substrate is used to assemble a LCM or the LCM is used to assemble a complete device, whether the edge of the TFT substrate in the LCM has a crack or chip can also be detected.

Figure 6:
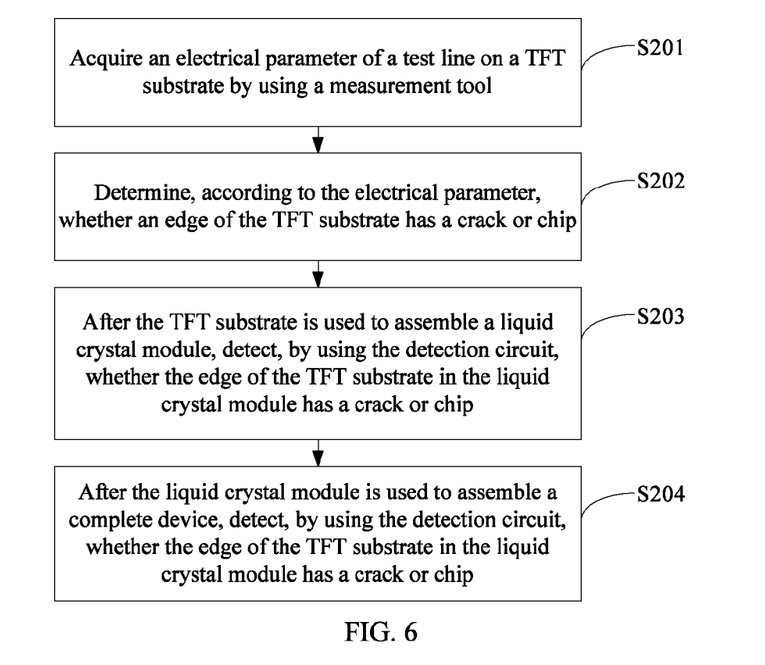
FIG. 6 is another schematic flowchart of a method for detecting a substrate crack according to an embodiment of the present disclosure.

To make a person skilled in the art more clearly understand a technical solution provided in this embodiment of the present disclosure, the method for detecting a substrate crack provided in this embodiment of the present disclosure is described below in detail using a specific embodiment. As shown in FIG. 6, the method includes S201: Acquire an electrical parameter of a test line on a TFT substrate using a measurement tool.

Exemplarily, the TFT substrate may be the TFT substrate 1 provided in the foregoing embodiment, as shown in FIG. 1. Reference may be made to S101, and details are not described again.

The measurement tool is configured to detect whether the test line 12 is on or off. The electrical parameter may be generally a parameter, such as a resistance value, a current value, or a voltage value. Therefore, a measurement tool such as a multimeter may be used.

For example, two measurement pens of the multimeter are respectively connected to two measurement points A1 and B1 of the test line 12, and a value of resistance of the test line 12 is acquired using the multimeter, or the measurement tool may be a multimeter and an external power supply, where the multimeter, the external power supply, and the test line 12 may be connected in series to form a loop, and a value of a current in the test line 12 is acquired using the multimeter, or the measurement tool may be an indicator and an external power supply, where the indicator, the external power supply, and the test line 12 are connected in series to form a loop, and an indication about whether the test line 12 is on or off is acquired using the indicator.

S202: Determine, according to the electrical parameter, whether an edge of the TFT substrate has a crack or chip. According to the electrical parameter acquired in S201, if the value of the resistance of the test line 12 is infinite, it indicates that the test line 12 is off, and it may be determined that the edge of the TFT substrate has a crack or chip, or if the value of the resistance of the test line 12 is not infinite, it indicates that the test line 12 is complete, and it may be determined that the edge of the TFT substrate does not have a crack or chip, or if the value of the current in the test line 12 is zero, it indicates that the test line 12 is off, and it may be determined that the edge of the TFT substrate has a crack or chip, or otherwise, it indicates that the test line 12 is complete, and it may be determined that the edge of the TFT substrate does not have a crack or chip, or if the indicator indicates that the test line 12 is off, it may be determined that the edge of the TFT substrate has a crack or chip, or if the indicator indicates that the test line is on, it may be determined that the edge of the TFT substrate does not have a crack or chip.

Certainly, the foregoing measurement methods are merely exemplary, and another detection method may be used to detect whether the test line 12 is on or off, to determine whether the edge of the TFT substrate has a crack or chip.

S203: After the TFT substrate is used to assemble a LCM, detect, using the detection circuit, whether the edge of the TFT substrate in the LCM has a crack or chip.

S204: After the LCM is used to assemble a complete device, detect, using the detection circuit, whether the edge of the TFT substrate in the LCM has a crack or chip.

For example, the detection circuit may be the detection circuit 3 provided in the foregoing embodiment. For example, the detection circuit 3 is connected to the TFT substrate 1, as shown in FIG. 4, the detection circuit 3 may be connected to the TFT substrate 1 using a connector, where the TFT substrate 1 has a first connector interface 14 (for example, a BTB interface female socket), and the detection circuit 3 has a second connector interface 34 (for example, a BTB interface male header). The detection circuit 3 acquires an electrical parameter at the connector in the detection circuit (that is, a connection point between a resistor 33 and the second connector interface 34, or a C point in FIG. 3), and a voltage is used herein as an example.

A power supply 32 and the resistor 33 in the detection circuit 3, the test line 12, and a GND end of the TFT substrate 1 form a series circuit. According to FIG. 3, a voltage at the C point is a voltage divided by internal resistance of the test line 12, and it may be known from a voltage division formula of the series circuit that the voltage is $$V_C = V \frac{R_T}{R + R_T}$$

where $V_C$ represents the voltage at the C point, V represents a voltage of the power supply 32, $R_T$ represents resistance of the test line 12, and R represents resistance of the resistor 33.

When the edge of the TFT substrate 1 has a crack or chip, the test line 12 is off at the crack or chip, and in this case, the resistance $R_T$ of the test line 12 is infinite, and $V_C$ is equal to V.

Therefore, as long as it is measured that the voltage at the C point is equal to the voltage of the power supply 32, it may be determined that the edge of the TFT substrate 1 has a crack or chip.

Exemplarily, a test bed 35 may perform voltage acquisition using an analog to digital converter interface 31 (ADC) to acquire the voltage at the C point. If an acquired voltage value is equal to a value of the voltage of the power supply 32, it is determined that the edge of the TFT substrate 1 has a crack or chip.

The TFT substrate may be detected by the detection circuit 3 after completion of substrate cutting, or after the TFT substrate is used to assemble an LCM, or after the LCM including the TFT substrate is used to assemble a terminal. The detection circuit 3 may be an independent detection circuit, and the TFT substrate is detected through external connection to the detection circuit 3, or the detection circuit 3 may be integrated into a LCM or a terminal, the terminal is used as a detection bed, and the LCM of the terminal can be detected using software for controlling the detection circuit.

In addition, for the TFT substrate 2, because no measurement point is disposed, after substrate cutting of the TFT substrate 2 is completed, after the TFT substrate 2 is used to assemble the LCM, and after the LCM including the TFT substrate 2 is used to assemble a terminal, a measurement circuit needs to measure a crack or chip on the edge of the substrate. Measurement may be performed using the detection circuit 3, where the method of measuring the test line 22 in the TFT substrate 2 using the detection circuit 3 is the same as the method of measuring the test line 12 in the TFT substrate 1 using the detection circuit 3, which is not described again.

According to the method for detecting a substrate crack provided in this embodiment of the present disclosure, an electrical parameter of a test line on a TFT substrate is measured using a measurement tool, and it is determined according to the electrical parameter of the test line whether the test line is on or off such that it can be determined whether an edge of the TFT substrate has a crack or chip. Compared with visual measurement used in the prior art, a detection omission can be avoided, detection efficiency is improved, and after the TFT substrate is used to assemble a LCM or the LCM is used to assemble a complete device, whether the edge of the TFT substrate in the LCM has a crack or chip can also be detected.

In the several embodiments provided in the present disclosure, it should be understood that the disclosed apparatus and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units. Some or all of the units may be selected according to actual needs to achieve the objectives of the solutions of the embodiments.

It may be clearly understood by a person skilled in the art that, for the purpose of convenient and brief description, division of the foregoing function modules is taken as an example for illustration. In actual application, the foregoing functions can be allocated to different function modules and implemented according to a requirement, that is, an inner structure of an apparatus is divided into different function modules to implement all or part of the functions described above. For a detailed working process of the foregoing apparatus, reference may be made to a corresponding process in the foregoing method embodiments, and details are not described herein again.

What is claimed is:

1. An electronic terminal, comprising:
   a liquid crystal display comprising a thin film transistor (TFT) substrate,
   wherein the TFT substrate comprises a glass substrate,
   wherein a non-closed test line having an opening is peripherally disposed on the glass substrate along an edge of the glass substrate,
   wherein the opening is formed by two end points of the test line,
   wherein one of the two end points is grounded,
   wherein the opening is located in an interference fit flexible printed circuit board on glass (FOG) bonding region between a flexible printed circuit board and the glass substrate,
   wherein the two end points of the opening are electrically connected to a first connector interface by using the flexible printed circuit board, wherein the first connector interface is configured to electrically connect to a connector interface of a detection circuit, and wherein the detection circuit is configured to measure whether the test line is on or off to determine whether an edge of the TFT substrate has a crack or chip.

2. The electronic terminal according to claim 1, wherein a conducting layer of the test line is manufactured as any conducting layer in a TFT substrate manufacturing process, and wherein the test line is manufactured together with a conductive pattern of the conducting layer in a patterning process for the conducting layer.

3. The electronic terminal according to claim 2, wherein the conducting layer is a gate metal layer, and wherein the conductive pattern of the conducting layer is a gate metal wire.

4. The electronic terminal according to claim 3, wherein a distance between the test line and the edge of the glass substrate is 150 micrometers (μm) to 200 μm.

5. The electronic terminal according to claim 2, wherein the conducting layer is a source drain metal layer, and wherein the conductive pattern of the conducting layer is a source drain metal wire.

6. The electronic terminal according to claim 5, wherein a distance between the test line and the edge of the glass substrate is 150 micrometers (μm) to 200 μm.

7. The electronic terminal according to claim 2, wherein the conducting layer is a transparent conducting thin film, and wherein the conductive pattern of the conducting layer is a pixel electrode.

8. The electronic terminal according to claim 7, wherein a distance between the test line and the edge of the glass substrate is 100 micrometers (μm).

9. The electronic terminal according to claim 1, further comprising a detection circuit, comprising:
   an analog to digital converter interface;
   a power supply;
   a resistor;
   a second connector interface; and
   a test bed,
   wherein the power supply is electrically connected to a first end of the resistor,
   wherein a second end of the resistor is electrically connected to the second connector interface,
   wherein a first end of the analog to digital converter interface is electrically connected to the second end of the resistor,
   wherein a second end of the analog to digital converter interface is electrically connected to the test bed,
   wherein a series circuit comprising the power supply, the resistor, and the TFT substrate is formed when a first connector interface in the TFT substrate is electrically connected to the second connector interface, and
   wherein the test bed is configured to:
      measure an electrical parameter at a connection point between the resistor and the second connector interface in the series circuit; and
      determine whether an edge of the TFT substrate has the crack or chip according to the electrical parameter.

* * * * *

UNITED STATES PATENT AND TRADEMARK OFFICE
CERTIFICATE OF CORRECTION

PATENT NO. : 9,983,452 B2
APPLICATION NO. : 15/326308
DATED : May 29, 2018
INVENTOR(S) : Yanfeng Jia, Lei Tang and Pengfei Xie Page 1 of 1

It is certified that error appears in the above-identified patent and that said Letters Patent is hereby corrected as shown below:

On the Title Page

Under Notice should read:
Subject to any disclaimer, the term of this patent is extended or adjusted under 35 U.S.C. 154 (b) by 0 days.

Signed and Sealed this
Tenth Day of July, 2018

Andrei Iancu
*Director of the United States Patent and Trademark Office*